United States Patent
Wollstein et al.

(10) Patent No.: US 6,936,480 B2
(45) Date of Patent: Aug. 30, 2005

(54) METHOD OF CONTROLLING THE CHEMICAL MECHANICAL POLISHING OF STACKED LAYERS HAVING A SURFACE TOPOLOGY

(75) Inventors: Dirk Wollstein, Dresden (DE); Stefan Lingel, Dresden (DE); Jan Räbiger, Dresden (DE)

(73) Assignee: Advanced Micro Devices, Inc., Austin, TX (US)

( * ) Notice: Subject to any disclaimer, the term of this patent is extended or adjusted under 35 U.S.C. 154(b) by 263 days.

(21) Appl. No.: 10/304,573

(22) Filed: Nov. 26, 2002

(65) Prior Publication Data

US 2004/0023490 A1 Feb. 5, 2004

(51) Int. Cl.$^7$ .............................................. H01L 21/00
(52) U.S. Cl. ................................ 438/8; 438/5; 438/14; 438/692; 216/84; 216/88; 216/89
(58) Field of Search ................................ 438/689, 690, 438/691, 692, 5, 14; 216/88–90, 84; 451/5, 36, 63

(56) References Cited

U.S. PATENT DOCUMENTS

| | | | |
|---|---|---|---|
| 6,171,174 B1 | 1/2001 | Campbell et al. | ............... 451/5 |
| 6,230,069 B1 * | 5/2001 | Campbell et al. | ........... 700/121 |
| 6,517,412 B2 * | 2/2003 | Lee et al. | ...................... 451/5 |
| 2002/0058460 A1 | 5/2002 | Lee et al. | ...................... 451/5 |

FOREIGN PATENT DOCUMENTS

| | | | |
|---|---|---|---|
| EP | 1 092 505 A2 | 4/2001 | ........... B24B/37/04 |
| JP | 10106984 A | 4/1998 | ......... H01L/21/304 |
| WO | WO 98/14306 | 4/1998 | ........... B24B/37/04 |

* cited by examiner

Primary Examiner—Nadine G. Norton
Assistant Examiner—Eric B. Chen
(74) Attorney, Agent, or Firm—Williams, Morgan & Amerson, P.C.

(57) ABSTRACT

An improved CMP controller allows the calculation of the polish time required for removing a patterned layer stack to a desired final thickness, wherein the initial layer thickness of each layer contained in the layer stack is employed. Moreover, a topography factor characterizing the surface structure of the layer stack and a selectivity characterizing the ratio of removal rates between adjacent material layers are used. Furthermore, a state variable of the controller represented by the removal rate of one of the layers may periodically be updated on the basis of the previously calculated polish time and a measurement value of the finally obtained layer thickness. The improved controller is particularly advantageous in the CMP process for STI isolation structures, in which the final thickness of a CMP stop layer, having a significantly reduced removal rate compared to the overlying dielectric layer, has to be precisely controlled.

44 Claims, 3 Drawing Sheets

METHOD OF CONTROLLING THE CHEMICAL MECHANICAL POLISHING OF STACKED LAYERS HAVING A SURFACE TOPOLOGY

BACKGROUND OF THE INVENTION

1. Field of the Invention

The present invention relates to the fabrication of integrated circuits, and, more particularly, to the chemical mechanical polishing of substrates having an uneven surface topology so as to remove excess material and to planarize the substrate surface, wherein two or more different material layers provided as a stack need to be polished.

2. Description of the Related Art

The fabrication of integrated circuits requires the deposition and subsequent patterning of material layers or stacks of material layers to form circuit elements, such as resistors, capacitors, transistors and the like. Since feature sizes of the circuit elements are steadily decreasing, whereas the diameter of the substrates on which the integrated circuits are manufactured has presently reached 300 mm, it is of great importance to precisely control the individual process steps in accordance with strictly-set process tolerances necessary for achieving a high production yield. For example, the photolithographic patterning of circuit elements strongly depends on the lithographic tool and the optical characteristics of the material layer to be patterned, including any overlying and underlying material layers. Therefore, the surface topography of the substrate, prior to the deposition of a photoresist, may have a significant influence on the patterning process. For this reason, it has become standard practice in the fabrication of sophisticated integrated circuits to planarize the substrate surface prior to critical process steps. One example in this respect is the formation of shallow trench isolation (STI) structures, which, in principle, are trenches formed in a substrate and filled with a dielectric material to electrically insulate adjacent substrate areas from each other. Since usually an extremely critical photolithography process for patterning gate electrodes of field effect transistors is carried out after formation of the STI structures, a thorough planarization of the substrate surface is required.

Since the chemical mechanical polishing (CMP) of substrates has been introduced for the first time in the fabrication of integrated circuits, this process technique has become a valuable and reliable means for providing a substantially planar substrate surface, even on large-diameter substrates. In chemically mechanically polishing a substrate, typically a chemical reagent is supplied to the surface of the substrate, usually in the form of a so-called slurry, which reacts with the material or materials to be removed. Simultaneously, the material and/or the reaction product thereof will be mechanically removed by abrasives that are present in a so-called polishing pad or that may also be supplied with the slurry. Upon establishing a relative motion between the substrate surface and the polishing pad, the material and/or the reaction product thereof is continuously removed, wherein the removal rate depends on the type of material, the type of slurry, i.e., the type of chemical reagent and the type of abrasives contained therein, the speed of the relative motion, the pressure with which the substrate is pressed on the polishing pad, the topography of the surface to be polished, and the like.

With reference to FIGS. 1 and 2, a typical process sequence for planarizing a substrate surface involving a CMP process will be discussed in more detail, thereby referring to a typical STI formation sequence. In FIG. 1a, a semiconductor structure 100 comprises a substrate 101, for example, a silicon substrate, having formed therein a plurality of trenches 102, and covered by a layer 103 of a dielectric material, such as silicon dioxide. Moreover, a silicon nitride layer 104 is provided outside the trenches 102 beneath the silicon dioxide layer 103. For convenience, any additional layers, such as a pad oxide layer underlying the silicon nitride layer 104 and an oxide layer within the trenches 102 that may be thermally grown, are not depicted in FIG. 1a.

Typically, the silicon nitride layer 104 is patterned by a photolithography process and is etched first, and then the trenches 102 are formed in the substrate 101 by performing an anisotropic etch process. Subsequently, the silicon dioxide 103 is deposited after forming a thin thermally grown oxide in the trenches 102 by appropriate deposition methods, such as chemical vapor deposition, to reliably fill the trenches 102. It is, therefore, necessary to deposit oxide in excess on the substrate 101, thereby creating a surface topography depending on the underlying structure defined by the trenches 102. As previously explained, excess material of the layer 103 is removed by CMP, wherein the silicon nitride layer 104 acts as a so-called stop layer to significantly "slow down" the CMP process by reducing the total removal rate once the overlying silicon dioxide is removed. The oxide layer 103 is provided with a thickness $D_{ox}$ targeted to reliably fill the trenches, as indicated in FIG. 1a, whereas the silicon nitride layer 104 has an initial layer thickness indicated by $D^i_{Nit}$ that is sufficiently large to stop the CMP process after having reliably removed the excess oxide without damaging the underlying substrate 101.

FIG. 1b schematically shows the semiconductor structure 100 after completion of the CMP step, wherein the excess oxide 103 over active regions is completely removed, and wherein the silicon nitride layer 104 has been partially removed to form a final silicon nitride, layer indicated by 104a, having a thickness at the end of the CMP process indicated by $D^f_{Nit}$. In this CMP process, it is extremely important to precisely control process parameters such that the final thickness of the silicon nitride layer 104a, $D^f_{Nit}$ matches a target value within strictly-set tolerances, since any overpolishing of the silicon nitride layer 104a may damage the underlying substrate 101, in which circuit elements, such as active areas of transistor elements, have to be formed. On the other hand, a silicon nitride layer 104 having a thickness $D^f_{Nit}$ exceeding the target value may have an adverse impact on the following critical photolithography patterning process, in which gate electrodes with dimensions of 0.25 μm and less may have to be formed.

Since it is extremely difficult, if not impractical, to measure the remaining thickness of the silicon nitride layer 104 at a predefined site of the substrate during the CMP process, it is attempted to "predict" the point in time when the targeted value for the thickness $D^f_{Nit}$ of the final silicon nitride layer 104a is reached. Since a plurality of different parameters have a significant influence on the CMP process, and since it is extremely difficult to individually control the plurality of process parameters, it is necessary to precisely monitor the removal rate, which represents the effect of the totality of the process parameters, so that, by selecting an appropriate process time, the final thickness of the silicon nitride layer 104a may be controlled. One possibility of monitoring the removal rate of the CMP is to determine the oxide thickness $D_{ox}$ and the final thickness $D^f_{Nit}$ of the silicon nitride layer 104a and the process time of a previously polished substrate to obtain an estimation of the actual removal rate. It turns out, however, that polishing a substrate on the basis of the previous removal rate may lead to a significant deviation of the final thickness $D^f_{Nit}$ from the target value, thereby jeopardizing the subsequent process steps, as is described earlier. This discrepancy between the target value and the actual thickness $D^f_{Nit}$ occurs for the following reasons. First, the removal rate may change during the actual CMP process so that, at the beginning of the instantaneous CMP process, a slightly different removal rate may prevail, especially when measurement results, on which the removal rate prediction is based, may be provided with a certain process-inherent delay. Second, at a certain stage of the CMP process, the removal rate is actually a composition of two terms that may per se exhibit quite different values. For instance, after removing the excess oxide of the layer 103, having a thickness of $D_{ox}$, the substrate surface includes portions with oxide 103 and portions with silicon nitride 104 that are to be simultaneously removed. Due to the quite different material properties, the removal rate of oxide and silicon nitride are quite different, wherein any variation of the nitride layer 104, for example, a variation of the initial layer thickness $D^i_{Nit}$, may have a significantly larger impact on the polish process than any variation of the oxide layer 103, so that the final thickness $D^f_{Nit}$ may not meet the process requirement.

FIG. 2 depicts, in a schematic manner, a typical progression of the removal rate during an STI polish process as depicted in FIGS. 1a and 1b during a first polish period, indicated as I, in which only the oxide 103 is removed. After planarizing the hills and valleys of the oxide layer 103, the initially high removal rate stabilizes at a substantially constant value indicated by $R_I$. At the end of period I, the silicon nitride layer 104 is exposed, and, thereafter, large areas of silicon nitride and the oxide in the trenches 102 are polished simultaneously, wherein due to the reduced removal rate of silicon nitride, the total removal rate rapidly drops to a second substantially constant removal rate indicated as $R_{II}$.

In order to obtain a desired final thickness $D^f_{Nit}$ of the nitride layer 104a, despite the above-identified difficulties, typically, the polish time for a substrate to be processed is calculated in a feed forward manner on the basis of the measured oxide thickness $D_{ox}$, the target value for the final thickness of the silicon nitride layer 104a, in the following noted as $D_{Nit}^{target}$, and a model of the CMP process. These predictive CMP models are typically based on the initial oxide thickness $D_{ox}$, however, slight variations of the initial thickness $D^i_{Nit}$ of the silicon nitride layer 104 or in the material composition may lead to a significant deviation from the target value $D_{Nit}^{target}$ for the final silicon nitride layer 104a. Thus, although the conventional CMP process control based on the oxide layer thickness measurement allows a significant improvement in predicting an appropriate polish time, there is still room for improvement of the CMP control to especially take into account any variations of the initial silicon nitride layer 104.

In view of the problems identified above, it is desirable to provide a technique that allows the planarization of patterned layer stacks comprising two or more different materials.

SUMMARY OF THE INVENTION

Generally, the present invention is directed to controlling the CMP process for removing a layer stack including two or more different material layers, wherein a CMP model is based on measurement results of the different material layers obtained prior to the CMP process so as to serve as feed forward information for precisely determining the polish time required to achieve the target value for the final thickness of the layer stack.

According to one illustrative embodiment of the present invention, a method of chemically mechanically polishing a patterned surface of a substrate is provided, wherein the surface has formed thereon a first layer and a second layer that is formed on the first layer. The method comprises determining a thickness of the first layer at a predefined region of the substrate and determining a thickness of the second layer at the predefined region. Next, a polish time is estimated on the basis of the determined thickness of the first and the second layers, a removal rate for material of the second layer and a selectivity factor specifying a removal rate for material of the first layer with respect to the removal rate for material of the second layer. Moreover, the substrate is polished for a time period that substantially corresponds to the estimated polish time.

In a further illustrative embodiment of the present invention, a method of determining a selectivity factor used in a CMP model for calculating a polish time for a substrate including a patterned layer stack including at least a first and a second material layer is provided. The model includes a currently valid selectivity, a state variable representing the removal rate of one of the layers in the layer stack when provided on a substantially plane substrate and a topography factor characterizing the structure of the layer stack. The method comprises obtaining the final thickness of the layer stack after completion of the polishing process for at least one first and at least one second substrate, wherein a structure of the layer stack of the first and second substrates is substantially identical. The method further includes calculating, on the basis of the model and a measured final thickness of the layer stacks of the first and second substrates, an intermediate updated selectivity value. Thereby, it is assumed that the removal rate representing the state variable is equal for the first and second substrates.

According to yet another embodiment of the present invention, a method of controlling a CMP process for a substrate including a structured layer stack including a first layer and a second layer comprises receiving a first measurement value indicative of the thickness of the first layer and receiving a second measurement value indicative of the thickness of the second layer. A topology factor is determined that represents a ratio of removal rates of the first or second layers having the structure and a removal rate of first or second layers when provided without the structure. Moreover, a selectivity of removal rates of the first and second layers is determined as a ratio of removal rates of the first and second layers when provided without the structure. Finally, a polish time is calculated on the basis of the first and second measurement values, the topology factor, the selectivity, a desired final thickness of the layer stack and a removal rate of the first or second layer without the structure.

BRIEF DESCRIPTION OF THE DRAWINGS

The invention may be understood by reference to the following description taken in conjunction with the accompanying drawings, in which like reference numerals identify like elements, and in which.

Figure 1A:
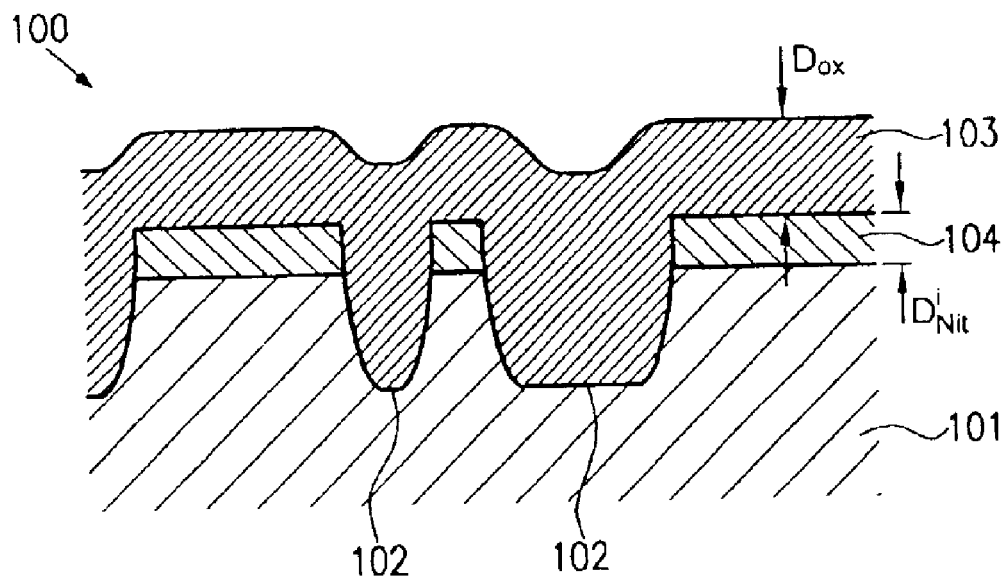
FIGS. 1a and 1b schematically show cross-sectional views of a semiconductor structure before and after a CMP process to remove excess material in an STI formation process.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

In the following detailed description of illustrated embodiments of the present invention, the STI polish process is frequently referred to as explained previously in the "Description of the Related Art." Although the present invention is particularly advantageous for this process sequence, in which two different material layers having very different removal rates are to be removed or partially removed, the present invention is applicable to any CMP sequence requiring the polishing of a layer stack provided on a patterned surface. Moreover, the present invention is not limited to a layer stack including two different material layers, but may be applied to a layer stack comprising three or more different material layers. It is thus intended that the present invention may not be limited to the polishing of two different layers, such as a silicon dioxide layer and a silicon nitride layer, unless otherwise explicitly referred to in the appended claims.

Figure 3:
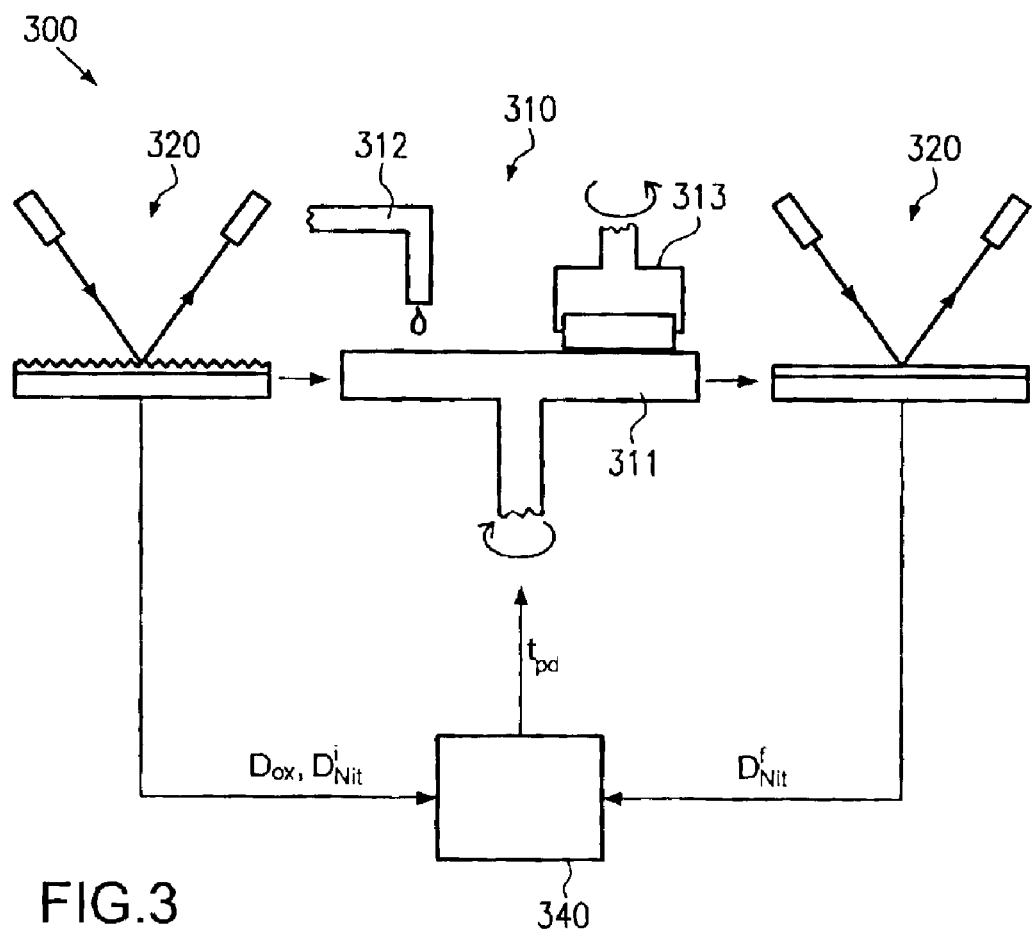
FIG. 3 schematically depicts a process tool for a typical CMP process in which the present invention may be implemented.

FIG. 3 schematically shows a system 300 for polishing a layer stack comprising, for example, the layers 103, 104 formed on a patterned surface of a substrate, such as the substrate 101. The system 300 comprises a CMP tool 310, represented by a polishing plate 311, a slurry supply 312 and a polishing head 313. Moreover, a first metrology tool 320 and a second metrology tool 330 are provided and adapted to measure the thickness of one or more layers at predefined locations on the substrate. Typically, the first and the second metrology tools 320, 330 may obtain measurement results by optically measuring the layer thickness. A suitable optical metrology tool may be an ellipsometer, as is readily available in semiconductor process lines. However, any other appropriate metrology tool may be used as long as it is configured to provide thickness measurement results in a required accuracy. Moreover, it may not be necessary to provide two different metrology tools, but instead a single metrology tool may be sufficient to provide measurement results before and after completion of the CMP process.

Furthermore, the system 300 comprises a control unit 340 that is configured to receive thickness measurement results from the first metrology tool 320, which are indicated as $D_{ox}$, $D^i_{Nit}$, and the measurement results of substrates having completed the CMP process, which are indicated as $D^f_{Nit}$. It should be noted that the measurement results obtained form the second metrology tool 330 represent measurement results from a previously processed substrate and may be used to update the removal rate employed in calculating the polish time for a substrate that is to be processed by the CMP tool 310, as will be explained in more detail later. Moreover, the control unit 340 is configured to output a signal representative for a determined polish time according to which the actual polish time of the CMP tool 310 is then selected. In some embodiments of the present invention, the control unit 340 may be implemented into the CMP tool 310, whereas, in other embodiments, the control unit 340 may be provided, partially or completely, externally from the CMP tool 310. The control unit 340 is further configured to establish an estimated polish time on the basis of the measurement results provided by the first and the second metrology tools 320, 330 and on the basis of a CMP model implemented in the control unit 340. As may readily be appreciated, the control unit may comprise a microprocessor, or a section thereof, including necessary peripheral devices to perform control functions described below. The control unit may be implemented in a PC as a set of appropriate instructions, or the control unit 340 may be implemented in a facility management system typically provided in semiconductor production lines. Preferably, the first and/or the second metrology tools 320, 330 are operatively connected with the control unit 340 to directly provide the measurement results, however, indirect entering of measurement results, for instance manually or via a storage medium, is also within the scope of the present invention.

Figure 4:
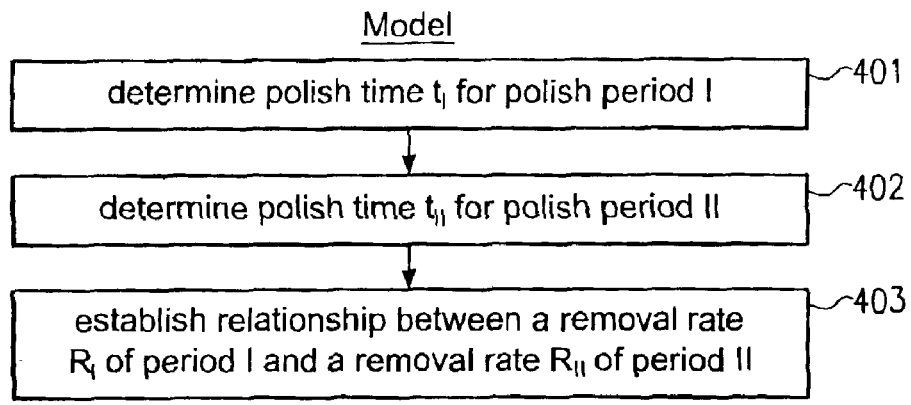
FIG. 4 is a flowchart representing a model of a CMP process according to one illustrative embodiment of the present invention.

With reference to FIG. 4, illustrative embodiments of the present invention for obtaining a CMP model used in the control unit 340 will now be described. In FIG. 4, according to step 401, the polish time for a first period of the CMP process is determined. The polish time of the first CMP period will be indicated as $t_I$. It is assumed that in the first CMP period a single material is to be removed from a patterned surface, as is illustrated, for example, in FIG. 1a. It is, therefore, referred in the following to the removal of oxide from a patterned surface, wherein it should be borne in mind that the oxide layer 103 may represent any material layer. With this assumption, the polish time $t_I$ may be represented by Equation 1:

$$t_I = \frac{D_{ox}^{target}}{F_{top} \cdot R_I} + \frac{D_{ox} - D_{ox}^{target}}{R_I} \tag{1}$$

In the first term of the right-hand side of Equation 1, $D_{ox}^{target}$ represents the target value of the thickness of the oxide layer 103 after completion of the deposition process. $R_I$ represents the removal rate for the type of material of the layer 103, in the present example silicon dioxide, wherein the polishing process, as previously explained, depends on a plurality of CMP parameters so that the removal rate represents the total effect of these process parameters when used for polishing the material contained in the layer 103. The factor $F_{top}$ represents a topology factor and is meant to compensate for the surface texture of the layer 103, thus the topology factor $F_{top}$ describes the difference in polishing a structured surface compared to a flat surface. It should be noted that the term removal rate used herein is to describe the velocity at which the thickness of a layer at a predefined location is decreased rather than the absolute amount of material that is removed within a given time period. That is, a structured surface including a plurality of "hills" may exhibit a high removal rate, since the "height" of the hills is more rapidly decreased compared to the thickness of a layer on a plane surface, although the amount of material removed from the plane surface may exceed the amount of material removed from the structured surface.

The second term on the right-hand side of Equation 1 includes the measurement results of the layer 103 at a predefined location, indicated as $D_{ox}$, and, thus, this term describes the time required for removing an "imaginary" material layer having a thickness determined by the difference of the thickness as deposited and the target value $D_{ox}^{target}$. For instance, if the actually measured thickness of the layer 103 $D_{ox}$ is less than the target value, this term is negative and reduces the polish time $t_I$ of the first polish period. Similarly, a larger initial thickness increases $t_I$.

By introducing the topology factor $F_{top}$, the removal rate $R_I$ may be considered equal to the removal rate of an unpatterned material layer, which is referred to as $R_{ox}$. Thus, Equation 1 substantially corresponds to the polish time of an unpatterned substrate, except for the topology factor $F_{top}$.

In step 402, a polish time $t_{II}$ for a second CMP period is determined. In this embodiment, it is assumed that the second CMP period requires the simultaneous removal of two different materials, such as the oxide 103 and the silicon nitride 104, as described in FIG. 1a. The polish time $t_{II}$ may then be represented by Equation 2:

$$t_{II} = \frac{D_{Nit}^i - D_{Nit}^f}{R_{II}} \quad (2)$$

Equation 2 describes the required polish time for reducing the thickness of layer 104 from an initial value $D_{Nit}^i$ to a final thickness $D_{Nit}^f$ for a given removal rate $R_{II}$. For proper control of the CMP process, it is, however, necessary to further specify the polish time $t_{II}$, since the removal rate $R_{II}$ strongly depends on the specific structure of the combined oxide/nitride surface of the substrate. Since the exposed nitride portion, after removing the excess oxide 103 (see FIG. 1a, the thickness $D_{ox}$), is determined by the structure to be formed, i.e., by the number and size of the trenches 102, the same topology factor $F_{top}$ may be used for further characterizing the removal rate $R_{II}$, as the same structure also determines the topography of the initial layer 103. Since the topology factor $F_{top}$ compensates for the influence of the surface topography with respect to the removal rate of an unpatterned surface, it may be assumed, in one embodiment, that the same topology factor also compensates for the patterned nitride structure defined by the trenches 102 of the substrate after exposing the silicon nitride layer 104. In other embodiments, a topology factor $F_{top}$ may be introduced that is directly proportional to the topology factor $F_{top}$, wherein the proportionality factor may be determined by experiment. Moreover, the CMP conditions during removal of the oxide layer 103 and the silicon nitride layer 104 are the same, except for the different material type in these layers, and thus the removal rates $R_I$ and $R_{II}$ may be considered substantially directly proportional to each other so that the removal rate $R_{II}$ may be written as Equation 3:

$$R_{II} = R_I \cdot \frac{F_{top}}{S}, \quad (3)$$

wherein 1/S is the proportionality factor describing the difference in removal rate of the layers 103 and 104. In the following, S will also be referred to as selectivity in polishing the layers 103 and 104. When considering an unstructured substrate where the topology factor $F_{top}$ is equal to 1, meaning that the substrate is completely covered by the nitride layer 104, the selectivity may be expressed by Equation 4:

$$R_{II} = \frac{R_I}{S} \Rightarrow S = \frac{R_{ox}}{R_{Nit}} \quad (4)$$

Here, it is evident that the selectivity S represents the ratio between the removal rate of oxide and nitride.

From the above Equations 1–4, the polish time for the CMP process may be determined. It should be noted that in embodiments requiring the polishing of a layer stack including more than two different layers, further corresponding removal rates $R_{III}$, $R_{IV}$ . . . may be introduced, wherein each of these additional removal rates corresponds to the simultaneous removal of two subsequent material layers, wherein the initial layer thickness, at a predefined location, and the target thickness of the bottom layer (for the top layer and any intermediate layer, the final thickness is equal to 0) determine the corresponding removal rate analogously to Equation 2. The additional removal rates may then be related to a single removal rate, for example, of the top most material layer, in a similar fashion as described with reference to Equations 3 and 4.

Thus, for a given removal rate $R_{ox}$, a selectivity S and a topology factor $F_{top}$, the polish time may be calculated for a desired target thickness $D_{Nit}^{target}$, in that $D_{Nit}^f$ in Equation 2 is replaced by $D_{Nit}^{target}$.

Figure 1B:
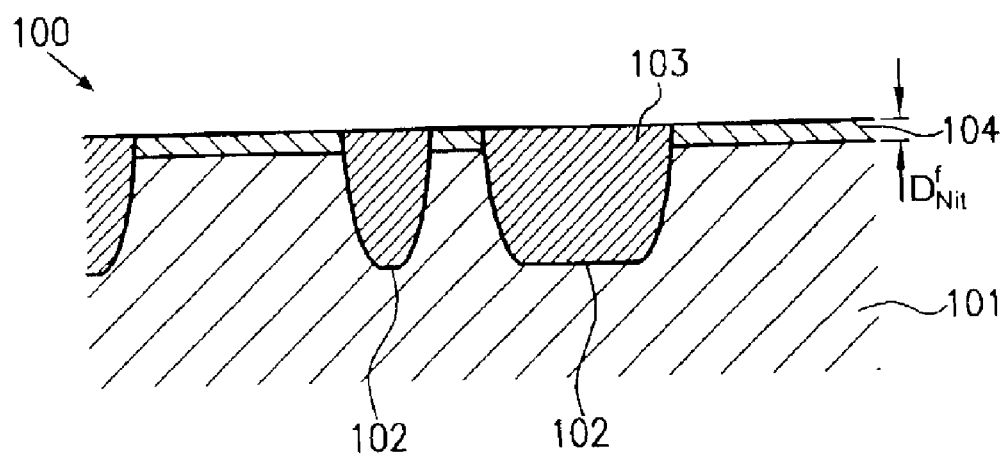
Figure 2:
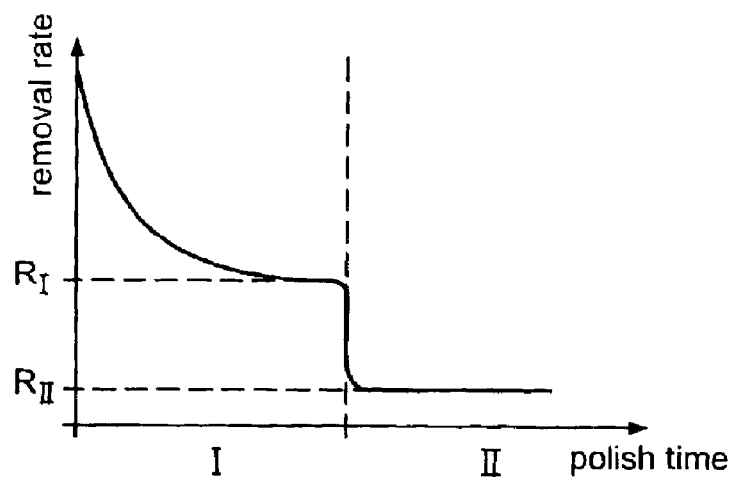
FIG. 2 is a graph that qualitatively shows the progression of the removal rate versus the polish time.
Figure 5:
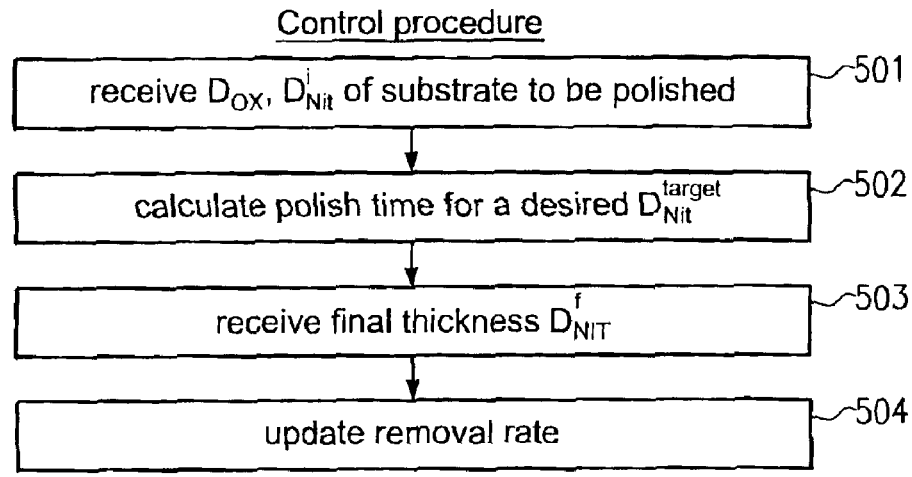
FIG. 5 is a flowchart representing a method for controlling the CMP process according to one embodiment of the present invention.

FIG. 5 shows a flowchart that illustratively describes a method for controlling a CMP process, such as the STI polish sequence described with reference to FIGS. 1a, 1b and 2, wherein the model described with reference to FIG. 4 is employed. As already indicated above, in order to calculate the polish time for achieving the target thickness $D_{Nit}^{target}$ of the CMP process, it is necessary to determine an initial set of values for the removal rate $R_{ox}$, the selectivity S and the topology factor $F_{top}$. In this set of parameters, the removal rate $R_{ox}$ functions as the state variable in the control sequence, while the selectivity S and the topology factor $F_{top}$ are "constants" of the control operation. It is to be noted, however, that the constants S and $F_{top}$ may only be considered as constants on a small-time scale, whereas, in the long run, these "constants" may vary, especially the selectivity S, as this parameter depends on material characteristics that may vary and may, therefore, need to be appropriately updated so as to continuously improve their accuracy or adapt these "constants" to the actual condition of the CMP station 310.

For example, the topology factor $F_{top}$ depends on the type of substrate to be processed, i.e., on the layout of the process level under consideration, and may be determined by theory and/or by experiment. For instance, on a test wafer comprising the trenches 102 in an identical fashion as the actual product substrate, a relatively thin material layer may be deposited in a highly conformal manner, and the polish time required for substantially completely removing the material outside the trenches 102 may be compared to a completely unpatterned substrate. The obtained ratio may then represent the topography factor. The selectivity S strongly depends, in addition to material characteristics, on CMP-specific parameters, such as the type of slurry used, the type of CMP tool, including such parameters as type of polishing pad, type of polishing head and the like. Thus, the selectivity S may be determined empirically by carrying out test measurements with different materials, the different removal rates of which then determine the corresponding selectivity. Moreover, a data analysis of previously processed substrates may allow the determination of the selectivity S. In other embodiments, as will be described in more detail with reference to FIG. 6, the selectivity may be determined in an automated manner so that any subtle changes of the CMP tool 310 may be readily taken into account by automatically updating the selectivity.

Prior to describing the control sequence, the polish time t may be described in a more convenient form that is substantially analogous to the polish time $t_f$ described in Equation 1. To this end, an effective initial nitride thickness can be defined in Equation 5:

$$D_{eff}^i = \frac{D_{ox}}{S} + D_{Nit}^i \tag{5}$$

wherein $D_{eff}^i$ represents the initial effective thickness, that is, the initial thickness of a single fictitious or virtual nitride layer instead of a combined oxide/nitride layer. Analogously, an effective target thickness $D_{eff}^{target}$ may be defined according to Equation 6:

$$D_{eff}^{target} = \frac{D_{ox}^{target}}{S} + D_{Nit}^i \tag{6}$$

The initial effective thickness $D_{eff}^i$ and the effective target thickness $D_{eff}^{target}$ after "deposition" represent the fictitious or virtual nitride layer, wherein the different effect of the CMP tool 310 on the nitride layer 104 and the oxide layer 103 is taken into account by the selectivity S. Thus, the polish time t may be expressed entirely in "nitride-related" terms according to Equation 7:

$$t = \frac{D_{eff}^{target} - D_{Nit}^{target}}{R_{Nit} \cdot F_{top}} + \frac{D_{eff}^i - D_{eff}^{target}}{R_{Nit}} \tag{7}$$

Formally, Equation 7 corresponds to Equation 1, wherein the first term represents the polish time required for removing nitride from the fictitious or virtual nitride layer having a target deposition thickness of $D_{eff}^{target}$ to a desired final nitride thickness $D_{Nit}^{target}$ having a surface topology described by the topography factor $F_{top}$. The second term of Equation 7 represents the polish time required for polishing a nitride layer, the thickness of which is defined by the difference of the "actual" thickness of the fictitious or virtual nitride layer, $D_{eff}^i$, and the target "deposition" thickness $D_{eff}^{target}$. As previously noted, when more than two layers are to be polished, a corresponding fictitious or virtual layer may be defined with corresponding selectivities describing the difference of removal rates of respective two adjacent layers.

In step 501 of FIG. 5, measurement results of the oxide layer 103, $D_{ox}$, and the nitride layer 104, $D_{Nit}^i$, are received from the first metrology tool 320.

In step 502, the polish time t is calculated using Equation 7 and the measurement values received in step 501. The calculated polish time t is output to the CMP tool 310 so that the actual polish time for the substrate to be processed may be adjusted to the calculated polish time t.

Then, in step 503, the measurement value $D_{Nit}^f$ is obtained, indicating the actual thickness of the nitride layer 104a. It should be noted that the measurement value $D_{Nit}^f$ does not necessarily have to be obtained from the same substrate that has been processed in the CMP tool 310 with the polishing time t determined in step 502. In some cases, a certain delay of measurement values may occur and $D_{Nit}^f$ may be obtained from a previously processed substrate with one or more substrates processed in between. It is to be ensured, however, that the actually used polish time t is calculated with the initial measurement results $D_{ox}$, $D_{Nit}^i$ and $D_{Nit}^f$ obtained from the same substrate.

Subsequently, in step 504, the state variable, i.e., the removal rate $R_{ox}$, is updated on the basis of the measurement value of the actual final nitride thickness $D_{Nit}^f$ of the layer 104a received in step 503 and Equation 7. To this end, in Equation 7, the nitride removal rate $R_{Nit}$ may be replaced by Equation 4 so that the following Equation 8 is obtained:

$$t = \left( \frac{D_{eff}^{target} - D_{Nit}^{target}}{R_{ox}} + \frac{D_{eff}^i - D_{eff}^{target}}{R_{ox} \cdot F_{top}} \right) \cdot S \tag{8}$$

Solving Equation 8 for the state variable $R_{ox}$ yields Equation 9:

$$R_{ox} = \left( \frac{D_{eff}^{target} - D_{Nit}^{target}}{t} + \frac{D_{eff}^i - D_{eff}^{target}}{t \cdot F_{top}} \right) \cdot S \tag{9}$$

Thus by replacing the target thickness $D_{Nit}^{target}$ of the nitride layer 104a by the actually measured thickness $D_{Nit}^f$ obtained in step 503, a corresponding updated state variable $R_{ox}^{new}$ can be obtained according to Equation 10:

$$R_{ox}^{new} = \left( \frac{D_{eff}^{target} - D_{Nit}^f}{t} + \frac{D_{eff}^i - D_{eff}^{target}}{t \cdot F_{top}} \right) \cdot S \tag{10}$$

In one particular embodiment, the value for the state variable $R_{ox}$ for the next substrate to be processed is obtained by using the updated value $R_{ox}^{new}$ and calculating a weighted average of the previous value of the state variable and the updated value calculated according to Equation 10. For example, an exponentially weighted moving average (EWMA) may be calculated according to Equation 11:

$$R_{ox} = (1-\mu) R_{ox}^{old} + \mu \cdot R_{ox}^{new} \tag{11}$$

wherein $\mu$ represents a value in the range of 0–1 and $R_{ox}^{old}$ represents the currently valid value of the state variable. Selecting $\mu$ close to 1 allows a rapid adaptation of the removal rate to any changes in the CMP process, since $R_{ox}^{new}$ calculated on the basis of the recently obtained $D_{Nit}^f$ will contribute to the value of the updated state variable $R_{ox}$ more dominantly than the previous state variable value $R_{ox}^{old}$.

After the updating of the state variable in step 504 is completed, the process flow returns to step 501 to receive the initial thickness measurement values for a next substrate to be processed.

It should be noted that the embodiments described so far refer to the calculation of the polish time t for every single substrate to be processed in the CMP tool 310. In other embodiments, however, two or more substrates, such as a plurality of substrates forming a lot, may be processed, wherein the polish time t is commonly calculated for the two or more substrates and the measurement results received in step 501 and/or 503 may be representative values for the two or more substrates, or, in one embodiment, may represent an average of the plurality of substrates.

Figure 6:
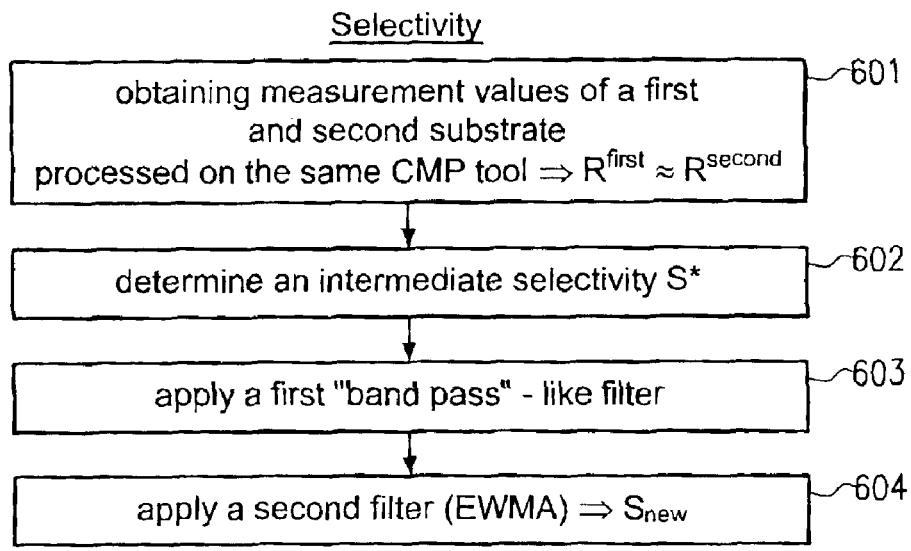
FIG. 6 is a flowchart representing a method for automatically obtaining a selectivity factor used in controlling a CMP process according to another illustrative embodiment of the present invention.

FIG. 6 represents a flowchart that illustratively describes embodiments of the present invention, which allow the automatic determination of the selectivity S required for calculating the polish time t according to the process flow described with reference to FIG. 5.

In step 601, a first substrate and a second substrate are processed on the CMP tool 310 and it is assumed that a removal rate $R_{ox}^{first}$ of the first substrate only slightly deviates from a removal rate $R_{ox}^{second}$ of the second substrate so that the removal rate for the first and second substrates are essentially given by Equation 10, wherein, in the term in brackets, the corresponding values for the first and second substrates are to be inserted. According to one embodiment, regarding any inaccuracy introduced by topography factors corresponding to different product substrates having different surface structures, it is further assumed that the first and the second substrates have the same layout, that is, have the same surface topology. Thus, the target thickness of the oxide layer 103 $D_{ox}^{target}$ is also the same for the first and second substrates.

Thus, according to step 602, by using Equations 5, 6 and 10 and with the assumption that the removal rates and the topography factors are respectively equal, an intermediate selectivity S* may be obtained by Equation 12:

$$S^* = \frac{(1 - F_{top})D_{ox}^{target}(t^{first} - t^{second})}{(D_{Nit}^{i,first} - D_{Nit}^{f,first})t^{second} - (D_{Nit}^{i,second} - D_{Nit}^{f,second})t^{first}} \quad (12)$$

wherein an upper index "first" or "second" of the corresponding variables refers to the first or the second substrate. The calculated intermediate selectivity S* may be very sensitive to any measurement inaccuracies, especially if the polish times $t^{first}$ and $t^{second}$ of the first and the second substrates are of similar magnitude. Furthermore, the assumption that the polishing rates $R_{ox}$ for the first and second substrates are equal is only an approximation, the validity of which strongly depends on the condition of the CMP tool 310. Therefore, the values of the calculated selectivity S* may vary in a wide range.

Therefore, in one embodiment, the calculated value S* is not directly used as an updated selectivity for the CMP model and, instead, an according filter criterion is applied to the calculated value S*. In one particular embodiment, two filters may sequentially be applied to the calculated value S* prior to determining the actual updated selectivity $S_{new}$.

In step 603, a "band pass" filter may be applied which, in one embodiment, may be an ideal band pass filter having an upper and a lower limit arranged around the previously valid selectivity indicated by $S_{old}$. For example, the band pass filter may be symmetrical with respect to the previous selectivity value $S_{old}$ and an appropriate constant C may be selected so that the upper limit is defined by $S^*_{old}+C$ and the lower limit is defined by $S^*_{old}-C$. Preferably, the constant C is selected to exclude any outlyers of S* that may be produced by any measurement fluctuations.

In step 604, after applying the band pass filter, a further filter may be applied, for example, in the form of a moving average, such as an EWMA filter, so that the updated selectivity $S_{new}$ may be obtained by Equation 13:

$$S_{new}=(1-\lambda)S_{old}+\lambda S^* \quad (13)$$

wherein $\lambda$ is a number in the range of 0–1. In one particular embodiment, $\lambda$ is selected from the range of 0.01–0.1 so that the variations of S* do not contribute very strongly to the updated value $S_{new}$. Thus, the updated selectivity $S_{new}$ slowly and continuously converges to the actual oxide/nitride selectivity. By applying the band pass filter centered around the currently valid selectivity $S_{old}$, extreme variations are excluded and the convergence against the desired selectivity is ensured. Moreover, in these embodiments, it is assumed that the first and second substrates represent the same surface structure, that is, the same product, so that in actual CMP processes requiring the processing of different products, the number of possible updates is reduced. Thus, in other embodiments, the corresponding topology factors $F_{top}^{first}$, $F_{top}^{second}$ of different products and the corresponding target oxide thicknesses may be used in determining the intermediate selectivity S*. On the other hand, using only identical products, and thus identical surface structures, for determining S* offers the advantage of significantly reducing the sensitivity to the topography factor $F_{top}$, as only one topography factor is used.

Moreover, the first substrate and the second substrate may represent a plurality of first and second substrates, respectively, and the corresponding measurement values and parameters may represent values for the entire first and second pluralities, respectively.

Furthermore, the process flow for obtaining an updated selectivity S may be readily extended to a plurality of selectivities required when more than two layers have to be polished. For example, the above-described procedure may be sequentially applied to the selectivities of a corresponding pair of adjacent layers, wherein the assumption regarding the topology factor and the removal rate of the first and second substrate may also be used.

As a result, by using the automated estimation of the selectivity S according to the embodiments as described above, the control unit 340 may detect and respond to any changes of the process steps prior to and/or during the CMP process. For instance, any changes in the deposition process for the first and/or the second layers 103, 104 may have an influence on the material composition and thus on the selectivity so that an automated dynamic adjustment of the selectivity S allows these process variations to be taken into account.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of chemically mechanically polishing a patterned surface of a substrate, the surface having formed thereon a first layer and a second layer, the method comprising:

determining a thickness of the first layer at a predefined region of the substrate;

determining a thickness of the second layer at the predefined region;

estimating a polish time on the basis of the determined thickness of the first and second layers, a removal rate for material of one of the first and second layers and a selectivity factor specifying a removal rate for material of the first layer with respect to a removal rate for material of the second layer;

polishing the substrate for a time period that substantially corresponds to the estimated polish time; and updating said selectivity on the basis of an intermediate selectivity value calculated on the basis of a first substrate and a second substrate processed in a substantially identical process sequence by applying a filter criterion to said intermediate selectivity value to obtain an undated selectivity.

2. The method of claim 1, wherein the first layer is positioned below said second layer and further comprising updating said removal rate for material of one of the first and second layers on the basis of a measurement value indicative of a final thickness of the first layer after completion of the polishing of said substrate.

3. The method of claim 2, wherein updating said removal rate for material of one of the first and second layers includes determining an average of the removal rate calculated on the basis of said measurement value and a currently valid removal rate.

4. The method of claim 3, wherein calculating an average is carried out by using an exponential weighted moving average.

5. The method of claim 1, further comprising empirically determining said selectivity factor.

6. The method of claim 1, further comprising determining said selectivity by performing at least one of analyzing data of previously processed substrates, carrying out test process runs and calculating the selectivity on the basis of at least one first and at least one second substrate and corresponding measurement values therefrom.

7. The method of claim 1, wherein applying a filter criterion comprises selecting a first positive constant and a second positive constant, adding the first positive constant to the currently valid selectivity, subtracting the second positive constant from the currently valid selectivity to define, respectively, an upper limit and a lower limit for said intermediate selectivity value and ignoring said intermediate selectivity value when it is outside a range defined by the upper and lower limits.

8. The method of claim 7, further comprising, when said intermediate selectivity value is within the range defined by the upper limit and the lower limit, forming an average of said intermediate selectivity value and the currently valid selectivity.

9. The method of claim 8, wherein forming an average includes using an exponentially weighted moving average.

10. The method of claim 9, wherein a weight of said intermediate value is in the range of approximately 0.01–0.1.

11. The method of claim 1, further comprising determining a model of the chemical mechanical polishing process on the basis of said removal rate for material of one of the first and second layer, a topography factor and the selectivity.

12. The method of claim 11, wherein, in determining said model, a removal rate of material of the first layer is assumed to be directly proportional to said topography factor.

13. The method of claim 12, wherein, in determining said model, a removal rate of material of the first layer is assumed to be proportional to a removal rate for material of the second layer.

14. The method of claim 1, wherein said first layer is the bottom layer and a thickness of the second layer is greater than a thickness of the first layer.

15. The method of claim 14, wherein said removal rate for material of one of the first and second layers is the removal rate of said second layer.

16. The method of claim 1, wherein said substrate comprises a third layer disposed between the first and the second layers.

17. The method of claim 16, wherein estimating said polish time is based on a first and a second selectivity that are indicative of the ratio of the removal rates of the third and second layers and of the second and first layers, respectively.

18. The method of claim 11, wherein, in said model, a polish time $t_I$ for the second layer is determined by a removal rate for material of the second layer $R_I$, an initial layer thickness of the second layer $D_{ox}$, and a target value for the initial thickness of the second layer $D_{ox}^{target}$ according to the following equation:

$$t_I = \frac{D_{ox}^{target}}{F_{top} \cdot R_I} + \frac{D_{ox} - D_{ox}^{target}}{R_I}.$$

19. The method of claim 17, wherein, in said model, a polish time $t_{II}$ for a final thickness of the first layer $D^f_{Nit}$ is given by the removal rate $R_{II}$ of the first layer and the initial layer thickness of the first layer $D^i_{Nit}$ by the following equation:

$$t_{II} = \frac{D^i_{Nit} - D^f_{Nit}}{R_{II}}.$$

20. The method of claim 18, wherein a removal rate $R_{II}$ for the first layer is given by the removal rate $R_I$ of the second layer, the topography factor and the selectivity by the following equation:

$$R_{II} = R_I \cdot \frac{F_{top}}{S}.$$

21. A method of determining a selectivity factor used in a CMP model for calculating a polish time for a substrate including a patterned layer stack including at least a first and a second material layer, said model including a currently valid selectivity, a state variable representing the removal rate of one of the layers in said layer stack when provided on a substantially plane substrate, and a topography factor characterizing the structure of said layer stack, the method comprising:

obtaining the final thickness of said layer stack after completion of the polishing process for at least one first and at least one second substrate, wherein a structure of the layer stack of the first and second substrates is substantially identical;

calculating, on the basis of said model and a measured final thickness of the layer stacks of the first and second substrates, an intermediate updated selectivity value;

wherein it is assumed that the removal rate representing the state variable is equal for the first and second substrates; and estimating an updated selectivity on the basis of said intermediate selectivity value by applying a filter criterion and subsequently calculating an average of the filtered intermediate selectivity value and the currently valid selectivity.

22. The method of claim 21, wherein applying said filter criterion results in ignoring said intermediate selectivity value when the intermediate selectivity value is outside of a predefined range centered around the currently valid selectivity.

23. The method of claim 21, further comprising, when the intermediate selectivity value is within said predefined range, calculating an exponentially weighted moving average.

24. The method of claim 22, wherein a weight for said intermediate selectivity value is in the range of approximately 0.01–0.1.

25. A method of controlling a CMP process for a substrate including a structured layer stack including a first layer and a second layer, the method comprising:
   receiving a first measurement value indicative of the thickness of the first layer;
   receiving a second measurement value indicative of the thickness of the second layer;
   determining a topology factor representing a ratio of removal rates of one of the first and second layers having said structure and a removal rate of said one of the first and second layers when provided without said structure;
   determining a selectivity of removal rates of the first and second layers as a ratio of removal rates of the first and second layers when provided without said structure; and
   calculating a polish time on the basis of the first and second measurement values, said topology factor, said selectivity, a desired final thickness of said layer stack and a removal rate of one of the first and second layers without said structure.

26. The method of claim 25, further comprising receiving a third measurement value indicative of a final thickness of said layer stack.

27. The method of claim 26, further comprising updating said removal rate of one of the first and second layers on the basis of said third measurement value.

28. The method of claim 25, wherein the second layer is formed on the first layer and said removal rate of one of the first and second layers is the removal rate of the second layer when provided without said structure.

29. The method of claim 28, wherein the second layer comprises silicon dioxide.

30. The method of claim 28, wherein the first layer comprises silicon nitride.

31. The method of claim 25, wherein said structure is defined by trenches formed in said substrate.

32. The method of claim 25, further comprising updating said selectivity on the basis of the first, second and third measurement values of a first and a second substrate processed on the same CMP tool.

33. The method of claim 32, further comprising calculating an intermediate selectivity and determining a weighted moving average of the intermediate selectivity and the currently valid selectivity.

34. The method of claim 33, further comprising selecting a weight factor equal to zero when said intermediate selectivity is outside of a predefined value range that includes the currently valid selectivity.

35. The method of claim 34, wherein said weighted moving average is an exponentially weighted moving average.

36. The method of claim 35, wherein said weight factor for the intermediate selectivity is in the range of approximately 0.01 to 0.1.

37. The method of claim 27, wherein updating said removal rate includes calculating a moving average of a recalculated value of the removal rate and the currently valid removal rate.

38. The method of claim 37, wherein said moving average is an exponentially weighted moving average.

39. A method of chemically mechanically polishing a patterned surface of a substrate, the surface having formed thereon a first layer and a second layer, the method comprising:
   determining a thickness of the first layer at a predefined region of the substrate;
   determining a thickness of the second layer at the predefined region;
   estimating a polish time on the basis of the determined thickness of the first and second layers, a removal rate for material of one of the first and second layers and a selectivity factor specifying a removal rate for material of the first layer with respect to a removal rate for material of the second layer;
   polishing the substrate for a time period that substantially corresponds to the estimated polish time; and
   determining a model of the chemical mechanical polishing process on the basis of said removal rate for material of one of the first and second layer, a topography factor and the selectivity, wherein, in determining said model, a removal rate of material of the first layer is assumed to be directly proportional to said topology factor.

40. The method of claim 39, further comprising, in determining said model, a removal rate of material of the first layer is assumed to be proportional to a removal rate for material of the second layer.

41. The method of claim 39, wherein, in said model, a polish time $t_I$ for the second layer is determined by a removal rate for material of the second lay $R_I$, an initial layer thickness of the second layer $D_{ox}$, and a target value for the initial thickness of the second layer $D_{ox}^{target}$ according to the following equation:

$$t_I = \frac{D_{ox}^{target}}{F_{top} \cdot R_I} + \frac{D_{ox} - D_{ox}^{target}}{R_I}.$$

42. The method of claim 41, wherein a removal rate $R_{II}$ for the first layer is given by the removal rate $R_I$ of the second layer, the topography factor and the selectivity by the following equation:

$$R_{II} = R_I \cdot \frac{F_{top}}{S}.$$

43. The method of claim 39, further comprising empirically determining said selectivity factor.

44. The method of claim 39, further comprising determining said selectivity by performing at least one of analyzing data of previously processed substrates, carrying out test process runs and calculating the selectivity on the basis of at least one first and at least one second substrate and corresponding measurement values therefrom.

* * * * *

UNITED STATES PATENT AND TRADEMARK OFFICE
CERTIFICATE OF CORRECTION

PATENT NO. : 6,936,480 B2
DATED : August 30, 2005
INVENTOR(S) : Dirk Wollstein et al.

It is certified that error appears in the above-identified patent and that said Letters Patent is hereby corrected as shown below:

Column 13,
Line 16, change "undated" to -- updated --.

Signed and Sealed this

First Day of November, 2005

JON W. DUDAS
*Director of the United States Patent and Trademark Office*